United States Patent [19]

Hammer

[11] 4,359,373

[45] Nov. 16, 1982

[54] METHOD OF FORMATION OF A BLAZED GRATING

[75] Inventor: Jacob M. Hammer, Lawrenceville, N.J.

[73] Assignee: RCA Corporation, New York, N.Y.

[21] Appl. No.: 273,324

[22] Filed: Jun. 15, 1981

[51] Int. Cl.$^3$ .............................................. C23C 15/00
[52] U.S. Cl. ................................. 204/192 E; 204/298
[58] Field of Search ............................ 204/192 E, 298

[56] References Cited

U.S. PATENT DOCUMENTS

| | | | |
|---|---|---|---|
| 3,860,783 | 1/1975 | Schmidt et al. | 219/121 EM |
| 3,867,012 | 2/1975 | Phillips | 350/96 WG |
| 3,912,363 | 10/1975 | Hammer | 350/96 C |
| 4,018,506 | 4/1977 | Hammer | 350/96 C |
| 4,097,117 | 6/1978 | Neil et al. | 350/96.17 |
| 4,097,118 | 6/1978 | Hammer | 350/96.17 |
| 4,131,506 | 12/1978 | Namba et al. | 156/643 |
| 4,227,769 | 10/1980 | Phillips et al. | 350/96.19 |
| 4,309,267 | 1/1982 | Boyd et al. | 204/192 E |

OTHER PUBLICATIONS

Somekh et al., Applied Optics 15 (1976) #8, pp. 1905–1906.
Boyd et al., Appl. Phys. Lett. 36 (7), 1980, pp. 583–585.
Aoyagi et al., Japan. J. Appl. Phys., 15 (1976), #4 pp. 721–722.
Matsui et al., Japan. J. Appl. Phys. 19 (1980), pp. L463–465.
Cantagrei, J. Vac. Sci. Technol., 12 (1975) pp. 1340–1343.

*Primary Examiner*—Arthur P. Demers
*Attorney, Agent, or Firm*—Birgit E. Morris; Donald S. Cohen; William J. Burke

[57] ABSTRACT

A method of forming a blazed grating in a surface of a body comprising the steps of forming a patterned layer having a grating therein overlying the surface of the body, non-uniformly coating the surface of the grating with a masking layer and exposing the non-uniformly coated surface to a material removal means which preferentially removes the patterned layer where it is uncoated and the surface of the body producing an asymmetric groove pattern in the surface of the body.

5 Claims, 1 Drawing Figure

METHOD OF FORMATION OF A BLAZED GRATING

The invention is a method for the formation of a blazed grating in the surface of a body and in particular, in the surface of a planar optical waveguide.

BACKGROUND OF THE INVENTION

A planar optical waveguide typically comprises a substrate, composed of a relatively low index of refraction dielectric material, supporting a planar layer of a relatively high index of refraction dielectric material. To couple a light beam propagating in an optical fiber into the planar optical waveguide there must be proper phase matching of the evanescent fields of light beams propagating in the optical fiber and the planar waveguide. Hammer, in U.S. Pat. No. 3,912,363 issued Oct. 14, 1975, entitled OPTICAL FIBER TO PLANAR WAVEGUIDE COUPLER and assigned to the assignee in the present application, has disclosed that the proper phase matching of the evanescent fields is enhanced by the use of a relief phase grating situated in the surface of the planar layer in close proximity to the coupling end of the optical fiber. The grating may be holographically recorded in the photoresist layer overlying the planar layer or produced in the planar layer by ion beam milling. A blazed grating, one having an asymmetric groove structure, is preferred since it will provide improved coupling efficiency between the optical fiber and the planar waveguide. Blazed gratings have been formed in a surface by masking of the surface and subsequent ion milling of the surface with the substrate oriented at an angle to the particle beam. Asymmetric grooves are then formed due to the shadowing effect of the masking layer on the particle beam. This method requires accurate deposition of the appropriate mask and subsequent accurate alignment of the surface to the particle beam. It would be desirable to have a method for the formation of a blazed grating which combine the simplicity of formation of a holographic grating in a light sensitive material with the ion milling technique which produces a grating in the planar layer itself.

SUMMARY OF THE INVENTION

A method of forming a blazed grating in a surface of a body comprising the steps of forming a patterned layer overlying the surface of the body and having a grating therein; coating the surface of the grating non-uniformly with a masking layer; exposing the non-uniformly coated grating surface to a material removal means which non-uniformly removes the masking layer, the patterned layer and a portion of the body thereby forming a blazed grating in the surface of the body.

DETAILED DESCRIPTION OF THE INVENTION

Figure 1:
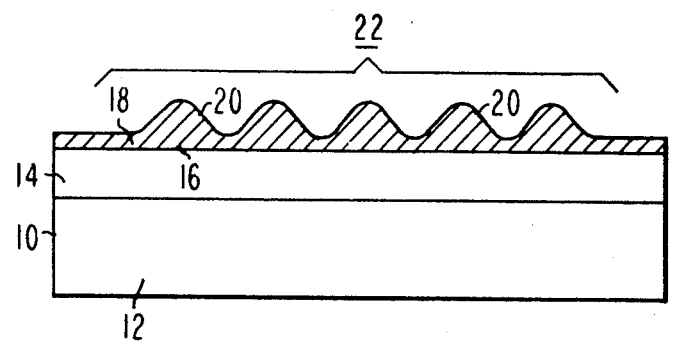
FIG. 1 is a cross-sectional view of a body having a pattern layer thereon.

The method of the invention can be described by reference to FIGS. 1 and 2 where a body 10 is composed of a substrate 12 having a planar waveguide layer 14 in a surface 16 thereof. Substrate 12 may be of LiTaO$_3$ and the planar waveguide 14 of LiTa$_x$Nb$_{1-x}$O$_3$ as disclosed by W. Phillips in U.S. Pat. No. 3,867,012 issued Feb. 18, 1975, entitled *NOVEL LITHIUM NIOBATE SINGLE CRYSTAL FILM STRUCTURE* and assigned to the assignee of the present application. A patterned layer 18 having a surface 20 overlies the surface 16, has a spatially varying thickness which forms a phase grating 22 having the desired periodicity and is typically composed of a photoresist material deposited by spinning techniques. The grating 22 may be formed, for example, using holographic techniques with subsequent development of the photoresist as is well known in the art. The grating is then non-uniformly coated with a masking layer 24 composed of a material which is more resistant to ion beam milling than is the material comprising the patterned layer 18. A useful material for the masking layer is chromium deposited by vacuum evaporation techniques and having a thickness between about 10 percent and about 50 percent of the grating spacing.

Figure 2:
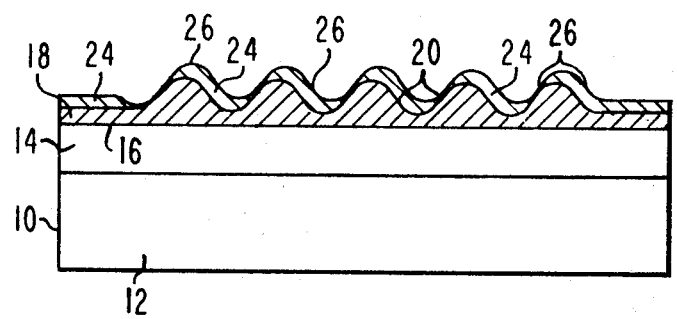
FIG. 2 is a cross-sectional view of a body having a pattern layer thereon which is non-uniformly coated with a masking layer.
Figure 3:
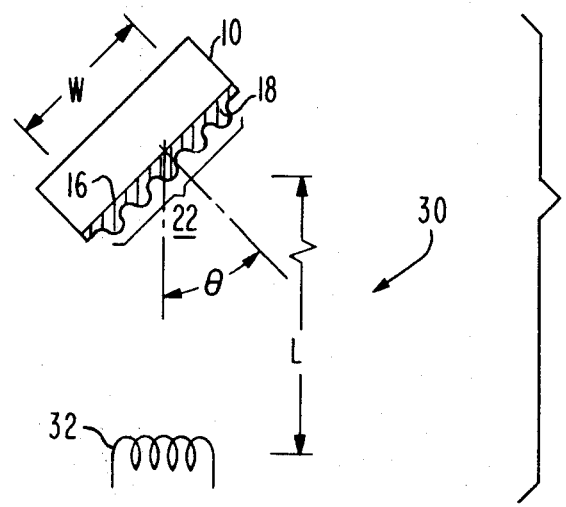
FIG. 3 is a schematic illustration of the arrangement used to non-uniformly coat the patterned layer.

The identification of the common components of FIG. 1 and the other figures is the same. In FIG. 3 the body 10 having the pattern layer 18 thereon is disposed a distance L from an evaporation source 32 and is tilted such that a normal to the surface 16 makes an angle $\theta$ between about 50° and 80° with a line connecting the body 10 and the evaporation source 32. The distance L between the evaporation source and the substrate is chosen to be sufficiently large so that the angle $\theta$ is substantially constant over the sample area and is at least about 20 times greater than the largest dimension of interest, here, the width W of the grating. Evaporation of the material comprising the masking layer onto the surface of the grating then preferentially coats those portions of the grating surface which are in the line of sight of the evaportion source and does not coat those surfaces which are shadowed from the source.

The surface 26 of the non-uniformly coated body is then exposed to an ion milling beam at near normal incidence using techniques well known in the art which removes material from the surface 26. Since the material comprising the patterned layer 18 and the non-uniform masking layer 24 are removed at different rates, the beam will first reach the surface 16 of the body 10 at those points where the masking layer 24 does not cover the patterned layer 18 and is continued until the desired depth of cut into the surface 16 of the body 10 has been made. Any remnants of the patterned and masking layers are then removed using a solvent for the patterned layer.

Figure 4:
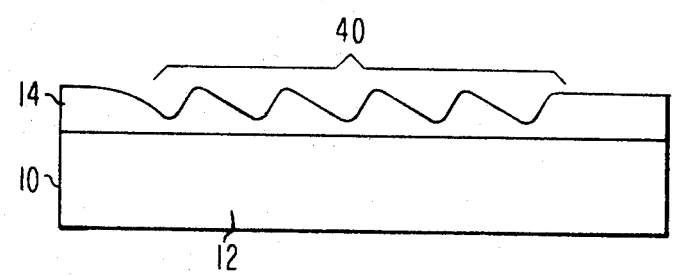
FIG. 4 is a cross-sectional view of a body having a blazed grating in a surface thereof.

In FIG. 4, the body 10, after ion milling and removal of the patterned and masking layers, has a blazed grating 40 which extends into the surface of the planar waveguide layer 14 and is composed of a multiplicity of asymmetrically shaped grooves having the periodicity of the original grating 22 in the patterned layer 18.

It is understood that other means for the non-uniform removal of material such as chemical etching which attacks the masking and patterned layers at different rates are also within the scope of the invention.

EXAMPLE

A blazed grating was formed in a body comprising a LiTaO$_3$ substrate having an about 1 micrometer thick layer of LiNb$_x$Ta$_{1-x}$O$_3$, prepared as in Phillips, supra, in a surface thereof. This surface was coated with an about 260 nanometer thick layer of LSI 395 Waycoat TM photoresist, by spin coating (Phillip A. Hunt Chemical Corp., Palisades Park, N.J.). The coated surface was then exposed to a pair of coherent, co-planar laser beams having a wavelength of 488 nanometers which intersected at an angle of about 50°. The exposed photoresist was developed using Waycoat TM Positive LSI Developer and then coated with about 100 nanometers of chromium incident on the grating surface at an angle of about 70°. The coated grating was then exposed to an argon ion beam at near normal incidence to form a blazed grating in the LiNb$_x$Ta$_{1-x}$O$_3$ body.

The resulting grating was tested as an output coupler by measurement of the efficiency of the coupling of 632.8 nanometer light propagating in the planar waveguide to air. The coupling was found to be dependent upon the direction of propagation of the light beam relative to the asymmetry in the grooves as expected for a blazed grating. The coupling efficiency was about 10 percent in one direction and about 20 percent in the opposite direction. In comparison, a typical coupling efficiency for an unblazed grating, under these conditions, is between about one and three percent.

I claim:

1. A method of forming a blazed grating in a surface of a body comprising the steps of:
    forming a patterned layer having a grating therein on the surface of the body;
    coating the surface of the grating non-uniformly with a masking layer; and
    exposing the non-uniformly coated surface to a material removal means whereby the masking layer, the patterned layer and a portion of the body are non-uniformly removed thereby forming a blazed grating in the surface of the body.

2. A method according to claim 1 wherein the material removal means is an ion beam incident on the patterned and masking layers.

3. A method according to claim 1 wherein the step of forming the patterned layer comprises exposing a layer of a photoresist material to a light interference pattern having the desired spacing between intensity maxima.

4. A method according to claim 2 wherein the step of non-uniformly coating the surface of the patterned layer with a masking layer comprises evaporating a layer of a material having a greater resistance to ion milling than the material comprising the patterned layer.

5. A method according to claim 3 wherein the step of evaporating the material comprising the masking layer comprises orienting the body such that the evaporated material impinges on the surface of the grating at an angle to normal incidence greater than 50°.

* * * * *